(12) United States Patent
Pai et al.

(10) Patent No.: US 6,555,442 B1
(45) Date of Patent: Apr. 29, 2003

(54) METHOD OF FORMING SHALLOW TRENCH ISOLATION WITH ROUNDED CORNER AND DIVOT-FREE BY USING DISPOSABLE SPACER

(75) Inventors: Chih-Yang Pai, Hsin-Chu (TW); Chih-Hsing Yu, Hsin-Chu (TW); Yeur-Luen Tu, Taichung (TW); Chia-Shiung Tsai, Hsin-Chu (TW); Min-Hwa Chi, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/042,075

(22) Filed: Jan. 8, 2002

(51) Int. Cl.$^7$ ................................................ H01L 21/76
(52) U.S. Cl. ...................................................... 438/424
(58) Field of Search ................................. 438/424, 692, 438/775, 691, 359, 221, 436, 438, 148, 242, 245; 216/38, 39, 87; 257/394, 374, 332, 329, 397, 510

(56) References Cited

U.S. PATENT DOCUMENTS

| | | | |
|---|---|---|---|
| 4,707,218 A | 11/1987 | Giammarco et al. | 156/643 |
| 5,679,599 A | 10/1997 | Mehta | 437/69 |
| 5,801,083 A | 9/1998 | Yu et al. | 438/424 |
| 5,933,749 A | 8/1999 | Lee | 438/435 |
| 6,074,932 A | 6/2000 | Wu | 438/435 |
| 6,228,747 B1 | 5/2001 | Joyner | 438/436 |
| 6,274,420 B1 * | 8/2001 | Xiang | 438/221 |
| 6,413,828 B1 * | 7/2002 | Lam | 438/296 |
| 6,432,797 B1 * | 8/2002 | Frost et al. | 438/424 |

OTHER PUBLICATIONS

"Shallow Trench Isolation for Advanced ULSI CMOS Technologies," N. Nandakumar et al., IEDM, 1998, pp. 98–133 to 98–126.

"New Corner Rounding Process for Sub–0.15$\mu$m Shallow Trench Isolation," W. G. Kim et al., IEDM, 1999, pp. 133–135.

"Advanced Shallow Trench Isolation to Suppress the Inverse Narrow Channel Effects for 0.24$\mu$m Pitch Isolation and Beyond," K. Horita et al., IEEE, 2000, pp. 178–179.

\* cited by examiner

Primary Examiner—Kamand Cuneo
Assistant Examiner—Trung Nguyen
(74) Attorney, Agent, or Firm—George O. Saile; Stephen B. Ackerman; Stephen G. Stanton (57) ABSTRACT

A method of fabricating an STI, comprising the following steps. A silicon structure having a pad oxide layer formed thereover is provided. An undoped poly buffer layer is formed over the pad oxide layer. A hard mask layer is formed over the undoped poly buffer layer. The hard mask layer, the undoped poly buffer layer and the pad oxide layer are patterned to form an opening exposing a portion of the silicon structure within an active area. The opening having exposed side walls. Inorganic spacers are formed over the exposed side walls. Using the patterned hard mask layer and the spacers as hard masks, the silicon structure is etched to form an STI opening within the active area. The inorganic spacers are removed exposing the upper corners of the STI opening. Using an oxidation process, a liner oxide layer is formed within the STI opening, over the upper corners of the STI opening and at least the patterned undoped poly buffer layer exposed by the removal of the inorganic spacers. An STI oxide layer is formed over the patterned hard mask layer, filling the liner oxide layer lined STI opening. The STI oxide layer is planarized and the patterned hard mask, the patterned undoped poly buffer layer and the patterned pad oxide layer are removed to fabricate the STI having rounded corners and without substantial divots.

37 Claims, 10 Drawing Sheets

METHOD OF FORMING SHALLOW TRENCH ISOLATION WITH ROUNDED CORNER AND DIVOT-FREE BY USING DISPOSABLE SPACER

FIELD OF THE INVENTION

The present invention relates generally to semiconductor fabrication and more specifically to methods of forming shallow trench isolation (STI) structures.

BACKGROUND OF THE INVENTION

Shallow trench isolation (STI) has become the most common and important isolation technology for sub-quarter micron complimentary metal oxide semiconductor (CMOS) devices. The edge treatment of STI is one of the key issues to suppress the corner effects and to maintain gate oxide integrity. Issues such as edge leakage, inverse narrow channel effect and "humps" in Id-Vg curves become critical as the isolation pitch is scaled down.

The conventional STI process flow includes pad oxide and chemical vapor deposition (CVD) silicon nitride (SiN) deposition, active area masking, nitride/oxide etching, silicon (Si) trench etching, liner oxidation, high density plasma (HDP) oxide filling, chemical mechanical polishing (CMP) polishing, and nitride and pad oxide removal.

Well known issues in conventional STI processes include corner rounding and divot formation (i.e. oxide recess) along STI edges. The divot at the edge of the STI is formed due to wet dip of pad oxide by an HF solution. Although the liner oxidation can round the corner of the STI edge, the degree of rounding may not be enough.

Several techniques have been developed to reduce the divot slightly by etching the edge of the nitride layer (referred to as "pull-back") after the silicon trench formation (but before liner oxidation). The corner is then exposed and becomes more rounded and thicker by the oxide growth by the subsequent liner oxidation. Another technique adds a poly-buffer layer in between the pad oxide and nitride (referred to as poly-buffer STI) so that the corner can become more rounded during liner oxidation. The poly-buffer layer also can reduce the stress from the nitride to the substrate. The pull-back and poly-buffer techniques may even be combined to result in even greater enhanced performance of STIs.

U.S. Pat. No. 6,228,747 B1 to Joyner, U.S. Pat. No. 5,801,083 to Yu et al. and U.S. Pat. No. 5,679,599 to Mehta each describe a disposable spacer in an STI and a rounded corner process.

U.S. Pat. No. 4,707,218 to Giammarco et al. describes a disposable spacer in an STI process.

U.S. Pat. No. 6,074,932 to Wu describes a related STI process.

U.S. Pat. No. 5,933,749 to Lee describes a process to round the top trench corner in an STI process.

The article entitled "Shallow Trench Isolation for advanced ULSI CMOS Technologies," N. Nandakumar et al., IEDM, 1998, pages 98–133 to 98–126, describes requirements in designing an STI process flow for 0.1 $\mu$m CMOS technologies. Various processing techniques are described for the steps in the STI flow, that is trench definition, corner rounding, gapfill, planarization and well implants.

The article entitled "New Corner Rounding Process for Sub-0.15 $\mu$m Shallow Trench Isolation," W. G. Kim et al., IEDM, 1999, pages 133 to 135, describes the evaluation of a process to obtain a top corner rounding in STI processes.

The article entitled "Advanced Shallow Trench Isolation to Suppress the Inverse Narrow Channel Effects for 0.24 $\mu$m Pitch Isolation and Beyond," K. Horita et al., IEEE, 2000, pages 178 and 179, describes a STI technique named Poly-Si-Buffered-mask STI (PB-STI) using an SiN/poly-Si/O$_2$ stacked mask.

SUMMARY OF THE INVENTION

Accordingly, it is an object of one or more embodiments of the present invention to provide an improved method of forming shallow trench isolation (STI) structures.

Other objects will appear hereinafter.

It has now been discovered that the above and other objects of the present invention may be accomplished in the following manner. Specifically, a silicon structure having a pad oxide layer formed thereover is provided. An undoped poly buffer layer is formed over the pad oxide layer. A hard mask layer is formed over the undoped poly buffer layer. The hard mask layer, the undoped poly buffer layer and the pad oxide layer are patterned to form an opening exposing a portion of the silicon structure within an active area. The opening having exposed side walls. Inorganic spacers are formed over the exposed side walls. Using the patterned hard mask layer and the spacers as hard masks, the silicon structure is etched to form an STI opening within the active area. The inorganic spacers are removed exposing the upper corners of the STI opening. Using an oxidation process, a liner oxide layer is formed within the STI opening, over the upper corners of the STI opening and at least the patterned undoped poly buffer layer exposed by the removal of the inorganic spacers. An STI oxide layer is formed over the patterned hard mask layer, filling the liner oxide layer lined STI opening. The STI oxide layer is planarized and the patterned hard mask, the patterned undoped poly buffer layer and the patterned pad oxide layer are removed to fabricate the STI having rounded corners and without substantial divots.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

The present invention discloses novel STI fabrication methods using a poly-buffer layer 14; 44 and disposable inorganic spacers 24; 54. The disposable inorganic spacers, be they nitride spacers 24 of the first embodiment or oxide spacers 54 of the second embodiment, allow for a process equivalent to the edge "pull-back" for exposing the sharp corner of the substrate 10; 40 to subsequent liner 28; 58 oxidation. Thus the STI corners 30; 60 are more rounded with thicker oxide and negligible divots to no divots are formed in the resulting STI structure 34'; 64'.

The top oxide layer 16' (first embodiment) or nitride film 46' (second embodiment) on an undoped poly layer 14'; 44' also serve as hard masks for silicon trench 26; 56 etching after the spacer 24; 54 formation. The forming of the silicon trench 26; 56 by hard-masks 16'; 46' provide for less microloading and low polymer generation during the trench etch. The STI fabrication methods of the present invention may be promising for future 0.1 µm CMOS devices.

First Embodiment—Nitride Spacers 24 (FIGS. 1 to 16)

Initial Structure

Figure 1:
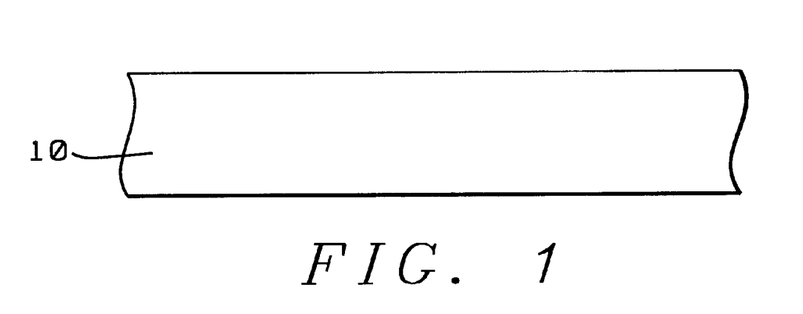
FIGS. 1 to 16 schematically illustrate a first preferred embodiment of the present invention.

As shown in FIG. 1, structure 10 is preferably a silicon substrate.

Growth of Pad Oxide 12

Figure 2:
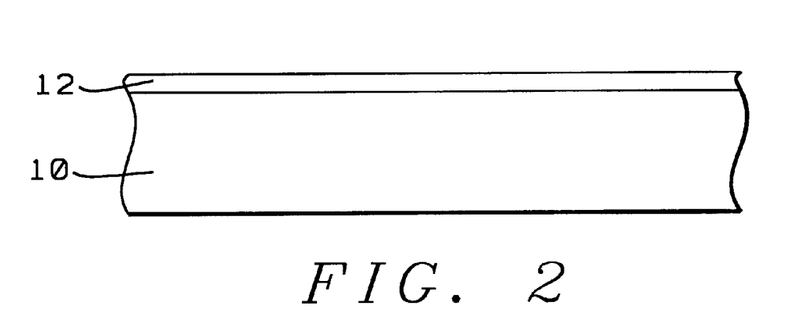

As shown in FIG. 2, pad oxide layer 12 is grown by any common oxidation process over silicon substrate 10 to a thickness of preferably from about 140 to 210 Å and more preferably from about 150 to 200 Å.

Deposition of Undoped Polysilicon Layer 14

Figure 3:
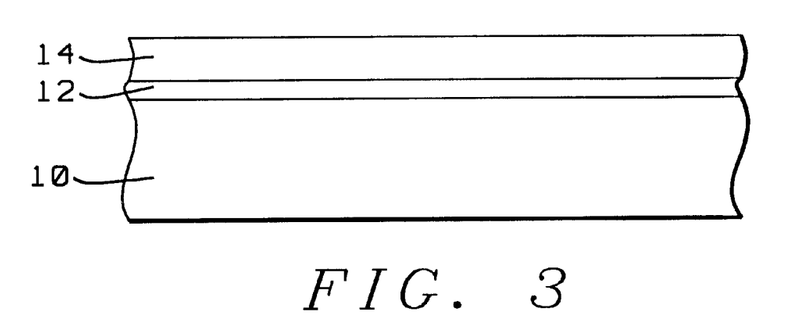

As shown in FIG. 3, undoped polysilicon (poly) layer 14 is deposited over pad oxide layer 12 to a thickness of preferably from about 900 to 2100 Å and more preferably from about 1000 to 2000 Å. Undoped poly layer 14 is preferably formed using a low pressure chemical vapor deposition (LPCVD) furnace.

Formation of Top Oxide Layer 16

Figure 4:
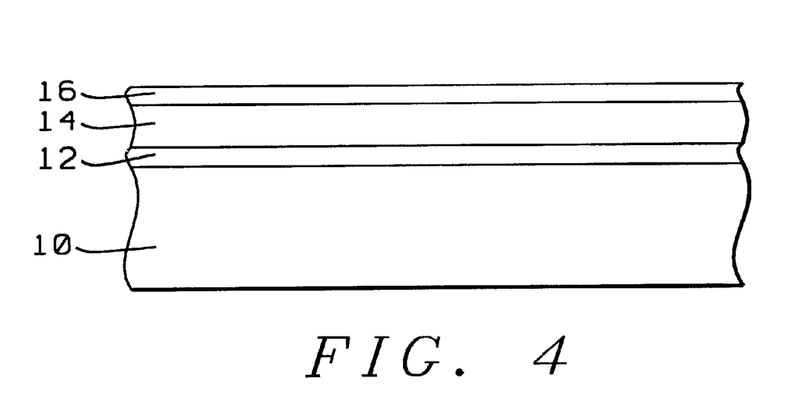

As shown in FIG. 4, the undoped poly layer 14 is oxidized to form a top oxide layer 16 having a thickness of preferably from about 400 to 1100 Å and more preferably from about 500 to 1000 Å. Top oxide layer 16 will function as a stop layer for the subsequent silicon nitride (SiN) spacer back etch and the shallow trench isolation (STI) dry etch as will be described.

Definition of Active Area 19

Figure 5:
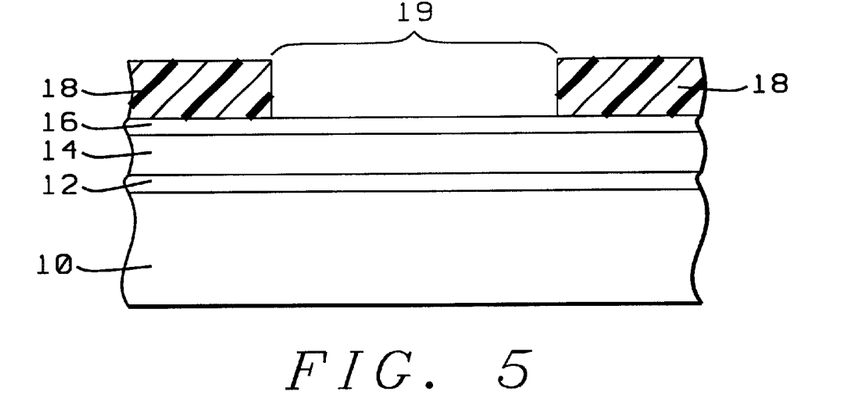

As shown in FIG. 5, a patterned photoresist (PR) layer 18 is formed over the top oxide layer 16 to define an active area 19. Active area 19 is preferably from about 1000 to 5000 Å wide and is more preferably from about 1500 to 3000 Å wide.

Etching of Layers 16, 14 and 12

Figure 6:
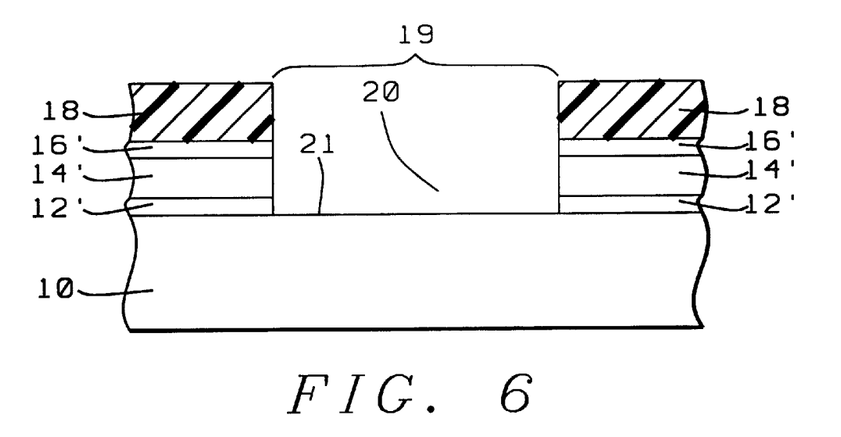

As shown in FIG. 6 and using patterned PR layer 18 as a mask, top oxide layer 16, undoped poly layer 14 and pad oxide layer 12 are etched with a two-step dry etch process to form opening 20 exposing a portion 21 of silicon substrate 10 and which minimizes the loss of silicon from silicon substrate 10.

Removal of Patterned PR Layer 18

Figure 7:
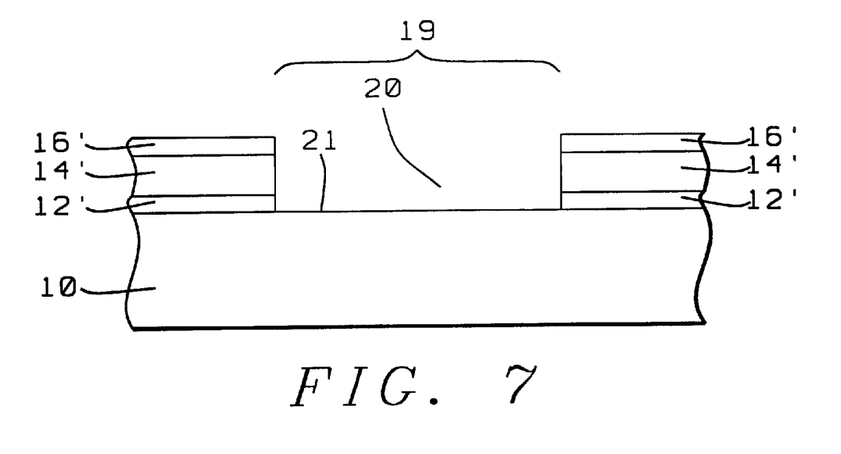

As shown in FIG. 7, the patterned PR layer 18 is removed and the structure is cleaned as necessary.

Deposition of Nitride Film 22

Figure 8:
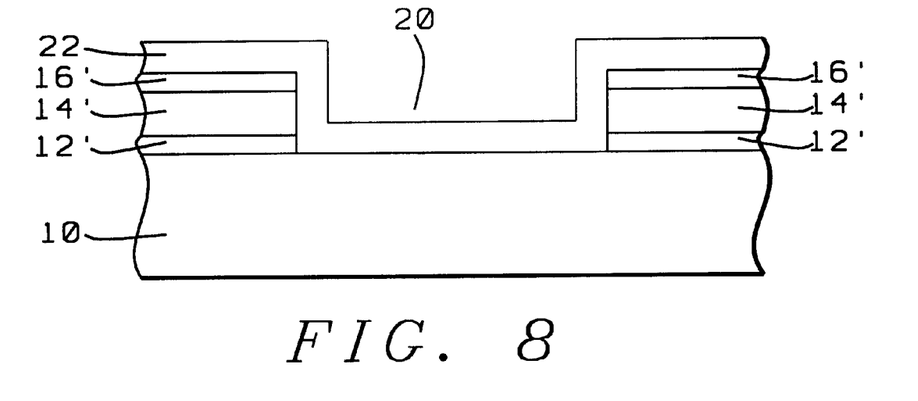

As shown in FIG. 8, a nitride or silicon nitride (nitride) film 22 is formed over patterned top oxide layer 16' and lining opening 20. Nitride film 22 is formed using an LPCVD furnace to a thickness of preferably from about 180 to 520 Å and more preferably from about 200 to 500 Å.

Nitride Film 22 Etch Back

Figure 9:
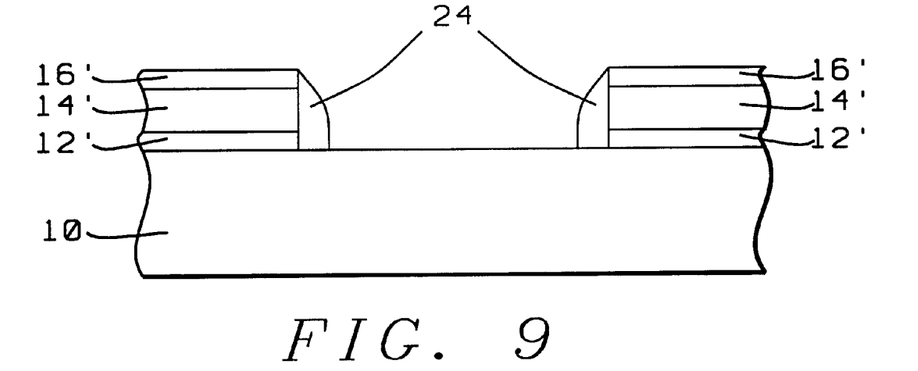

As shown in FIG. 9, the nitride film 22 is etched back to form nitride spacers along the side walls of opening 20. The patterned top oxide layer 16' and the portion 21 of silicon substrate 10 each function as stop layers for the nitride etch back. The nitride spacers 24 are preferably from about 100 to 500 Å wide and more preferably from about 200 to 300 Å wide.

The nitride spacers 24 will be used in the patterned pad oxide layer 12'/undoped poly layer 14'/top oxide layer 16' pull back process for more rounded corners 30 for the STI 34' formed as will be described.

STI Opening 26 Dry Etch

Figure 10:
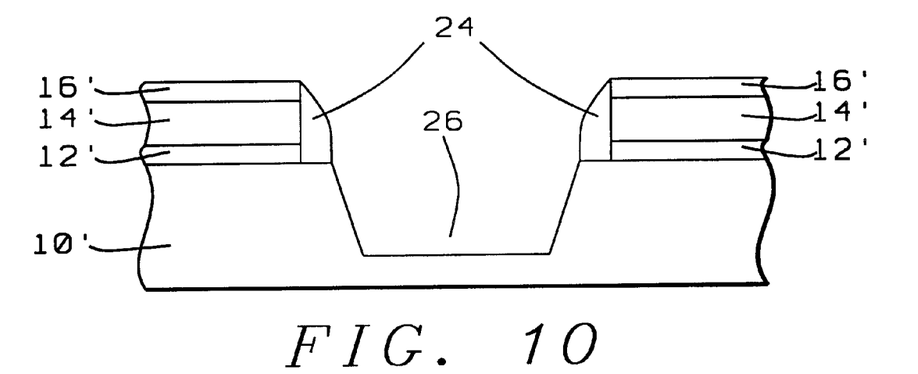

As shown in FIG. 10, an STI dry etch process is performed using the patterned top oxide layer 16' and the nitride spacers 24 as hard masks (which has less micro-loading due to low polymer generation) to form STI opening 26 within silicon substrate 10.

Removal of Nitride Spacers 24

Figure 11:
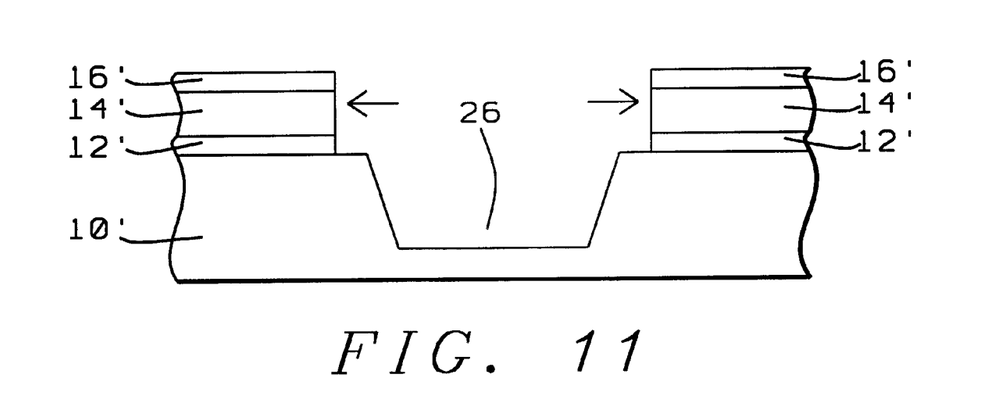

As shown in FIG. 11, the nitride spacers 24 are removed using an aqueous $H_2PO_4/H_2O_2$ solution. This effectuates a patterned pad oxide layer 12'/undoped poly layer 14'/top oxide layer 16' pull back.

Formation of Liner Oxide Layer 28

Figure 12:
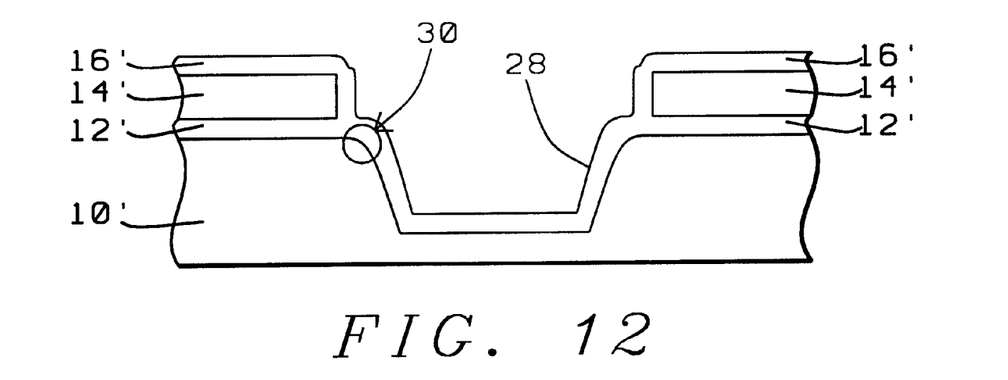

As shown in FIG. 12, a liner oxide layer 28 is formed over the exposed portions of the patterned poly layer 14' and the etched silicon substrate 10' using a high temperature oxidation furnace having a temperature of preferably from about 950 to 1150° C. and more preferably from about 1000 to 1100° C. The liner oxide layer 28 is preferably from about 180 to 620 Å thick and more preferably from about 200 to 600 Å thick. Thicker oxide is formed at the top and edge of the patterned undoped poly layer 14'. The STI corner (as at 30) will be rounded by the liner oxidation combined with the patterned pad oxide layer 12'/undoped poly layer 14'/top oxide layer 16' pull back.

Deposition of HDP Film 32

Figure 13:
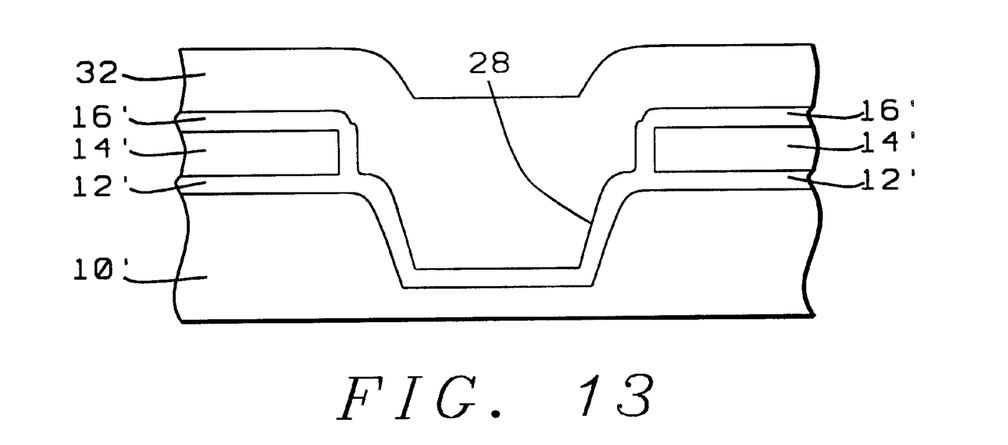

As shown in FIG. 13, high density-plasma (HDP) oxide film 32 is deposited over the patterned top oxide layer 16' and filling the liner oxide layer 28 lined opening 28 for the STI filling.

Oxide CMP

Figure 14:
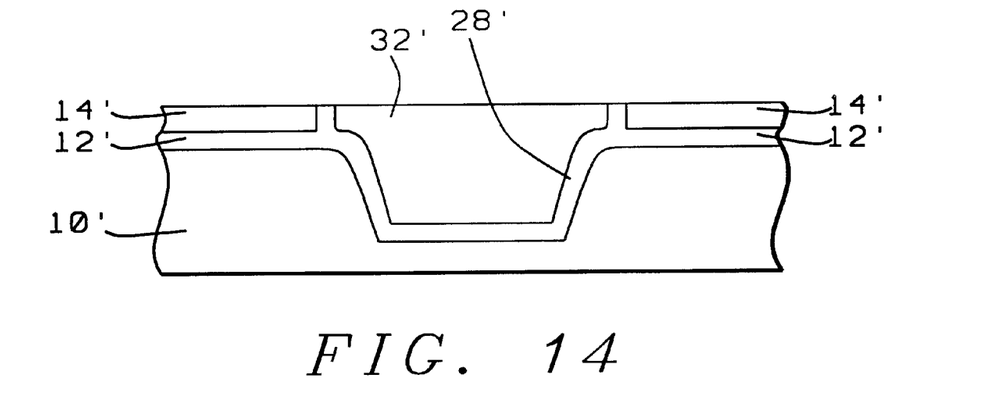

As shown in FIG. 14, an oxide chemical mechanical polish (CMP) is performed to remove the patterned top oxide layer 16' and the excess of the HDP film 32 to form a planarized structure stopping upon the patterned undoped poly layer 14' by using either time mode or a slurry having non-selectivity between oxide and polysilicon.

Removal of Patterned Undoped Poly Layer 14'

Figure 15:
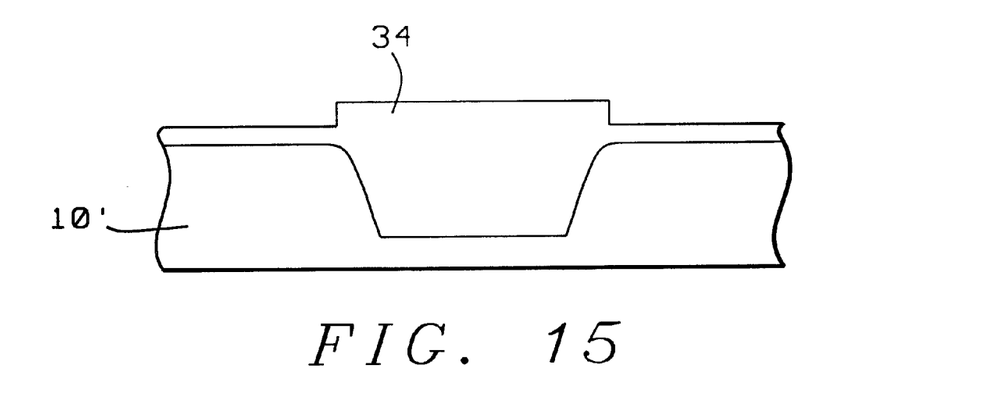

As shown in FIG. 15, the patterned undoped poly layer 14' is removed using an SC1 solution ($H_2O/NH_4OH/H_2O_2$) with a high polysilicon/silicon oxide selectivity.

Final STI Structure 34'

Figure 16:
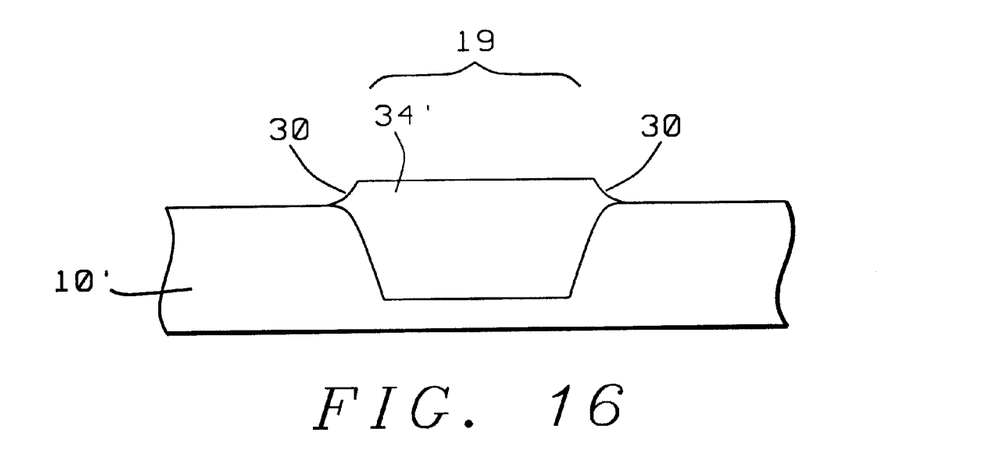

As shown in FIG. 16, the patterned pad oxide layer 12' is removed to form the final STI structure 34' that has rounded corners 30 and without divots.

Second Embodiment—Oxide Spacers 54 (FIGS. 17 to 32)

Initial Structure

Figure 17:
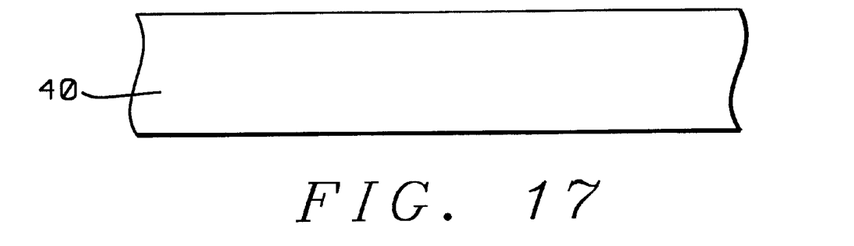
FIGS. 17 to 32 schematically illustrate a second preferred embodiment of the present invention.

As shown in FIG. 17, structure 40 is preferably a silicon substrate.

Growth of Pad Oxide 42

Figure 18:
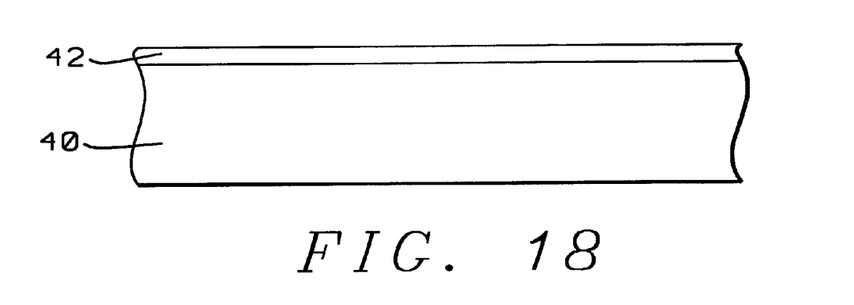

As shown in FIG. 18, pad oxide layer 42 is grown by any common oxidation process over silicon substrate 40 to a thickness of preferably from about 140 to 210 Å and more preferably from about 150 to 200 Å.

Deposition of Undoped Polysilicon Layer 44

Figure 19:
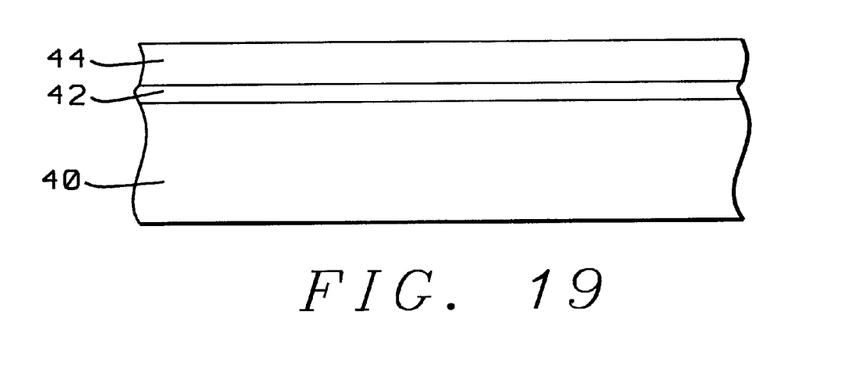

As shown in FIG. 19, undoped polysilicon (poly) layer 44 is deposited over pad oxide layer 42 to a thickness of preferably from about 900 to 2100 Å and more preferably from about 1000 to 2000 Å. Undoped poly layer 44 is preferably formed using a low pressure chemical vapor deposition (LPCVD) furnace.

Formation of Nitride Film 46

Figure 20:
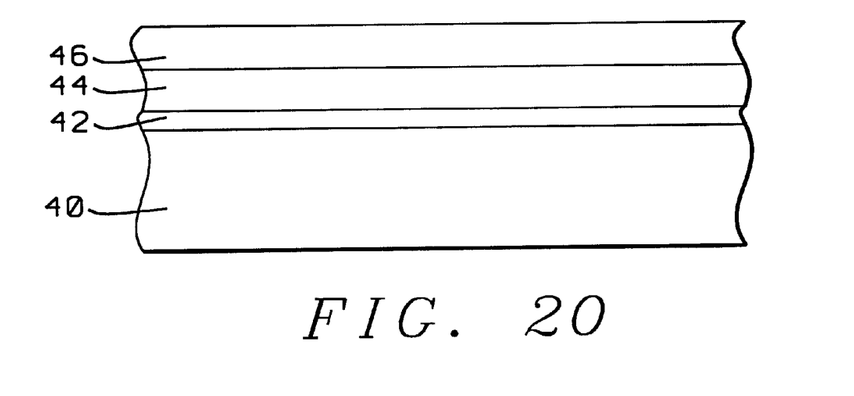

As shown in FIG. 20, nitride or silicon nitride is deposited over undoped poly layer 44 to form a nitride film 46 having a thickness of preferably from about 900 to 2100 Å and more preferably from about 1000 to 2000 Å. The nitride film 44 is formed using an LPCVD furnace. The nitride film 46 will function as a stop layer for the subsequent silicon oxide (oxide) spacer back etch and the shallow trench isolation (STI) dry etch as will be described.

Definition of Active Area 49

Figure 21:
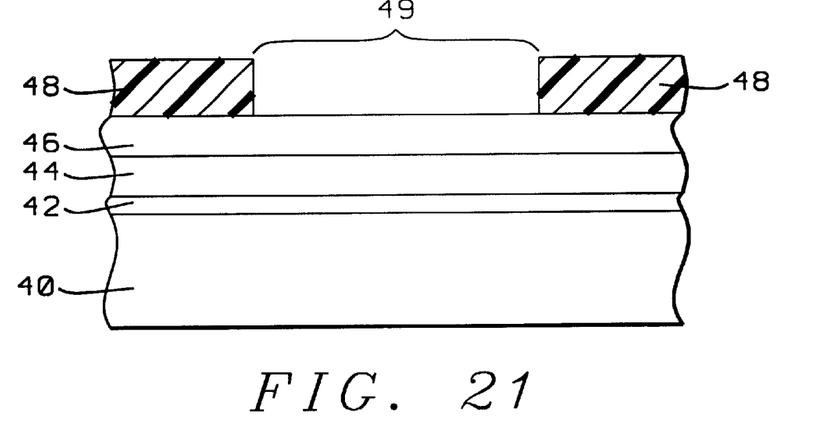

As shown in FIG. 21, a patterned photoresist (PR) layer 48 is formed over the nitride film 46 to define an active area 49. Active area 49 is preferably from about 1000 to 5000 Å wide and is more preferably from about 1500 to 3000 Å wide.

Etching of Layers 46, 44 and 42

Figure 22:
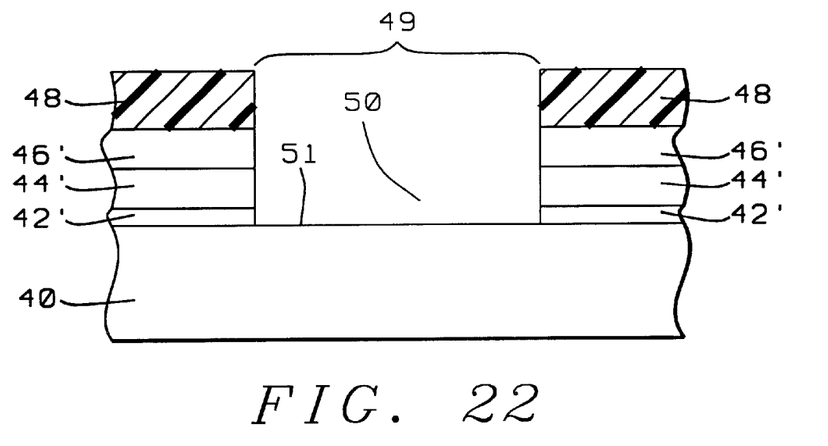

As shown in FIG. 22 and using patterned PR layer 48 as a mask, nitride film 46, undoped poly layer 44 and pad oxide layer 42 are etched with a two-step dry etch process using separate etching chambers to form opening 50 exposing a portion 51 of silicon substrate 40. The two-step dry etch process is minimizes the loss of silicon from silicon substrate 40.

Removal of Patterned PR Layer 48

Figure 23:
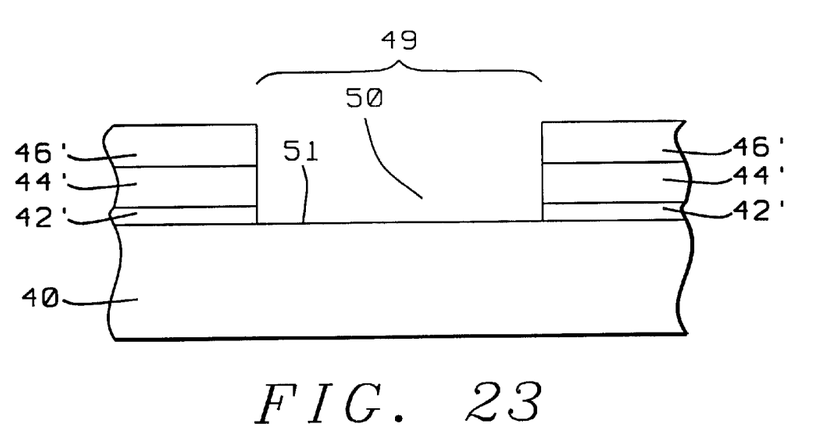

As shown in FIG. 23, the patterned PR layer 48 is removed and the structure is cleaned as necessary.

Deposition of Oxide Film 52

Figure 24:
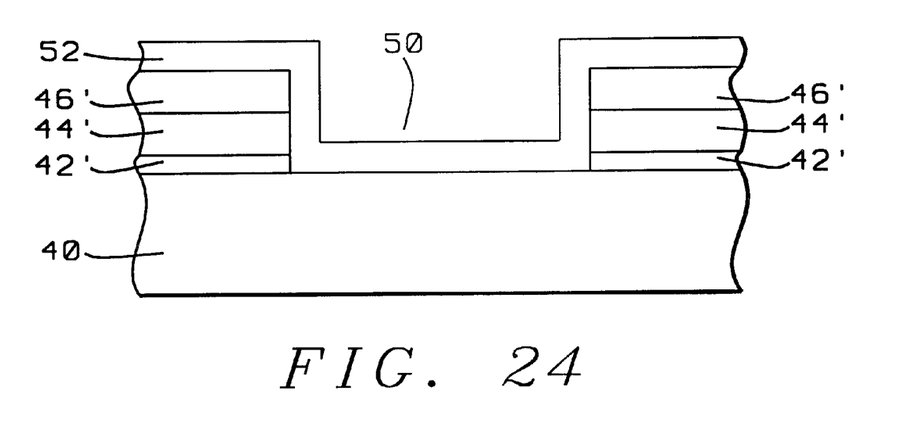

As shown in FIG. 24, a silicon oxide (oxide) film 52 is formed over patterned nitride film 46' and lining opening 50 by using either a plasma enhanced CVD (PECVD) tool or a low pressure CVD (LPCVD) tool. Oxide film 52 has a thickness of preferably from about 180 to 520 Å and more preferably from about 200 to 500 Å.

Oxide Film 52 Etch Back

Figure 25:
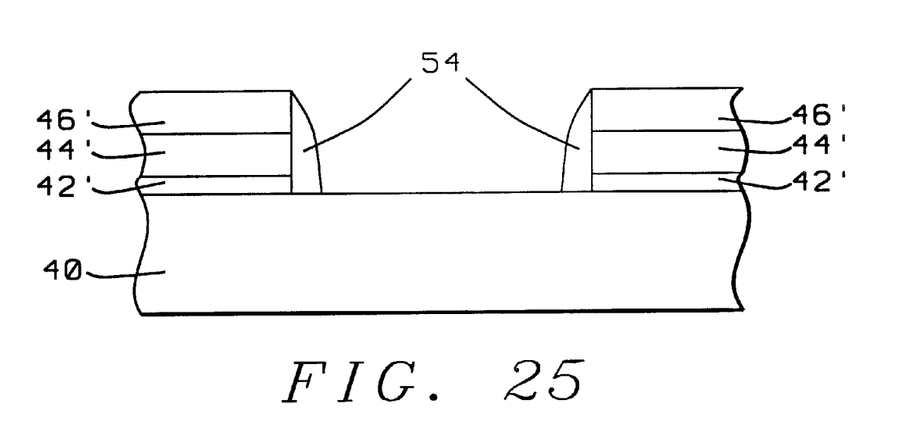

As shown in FIG. 25, the oxide film 52 is etched back to form oxide spacers 54 along the side walls of opening 50. The oxide spacers 54 are preferably from about 100 to 500 Å wide and more preferably from about 200 to 300 Å wide.

The oxide spacers 54 will be used in the patterned pad oxide layer 42'/undoped poly layer 44'/nitride film 46' pull back process for more rounded corners 60 for the STI 64' formed as will be described.

STI Opening 56 Dry Etch

Figure 26:
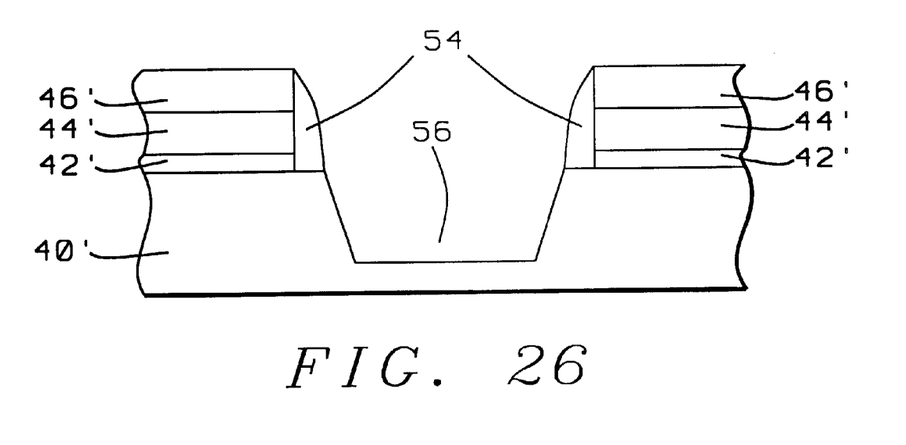

As shown in FIG. 26, an STI dry etch process is performed using the patterned nitride film 46' and the oxide spacers 54 as hard masks (which has less micro-loading due to low polymer generation) to form STI opening 56 within silicon substrate 40.

Removal of Oxide Spacers 54

Figure 27:
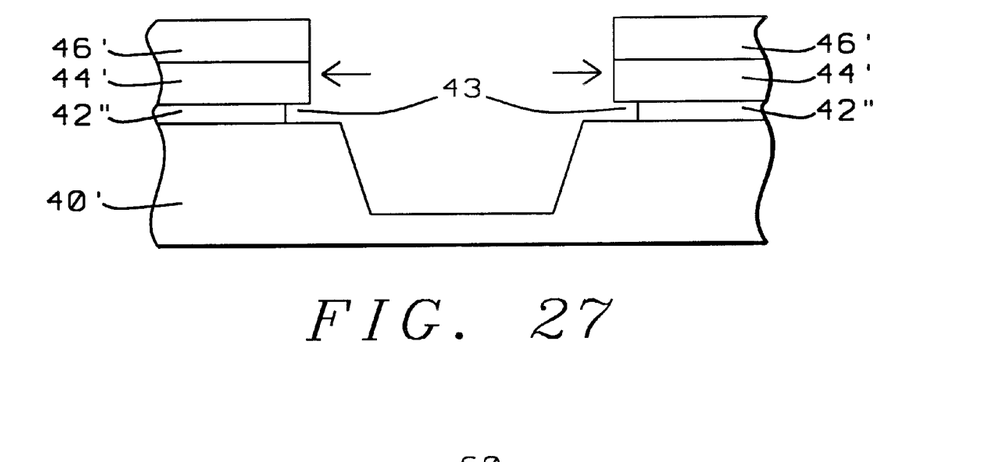

As shown in FIG. 27, the oxide spacers 54 are removed using an HF solution which also further pulls back the patterned undoped poly layer 42' as at 43 to form a further pulled back undoped poly layer 42".

Formation of Liner Oxide Layer 58

Figure 28:
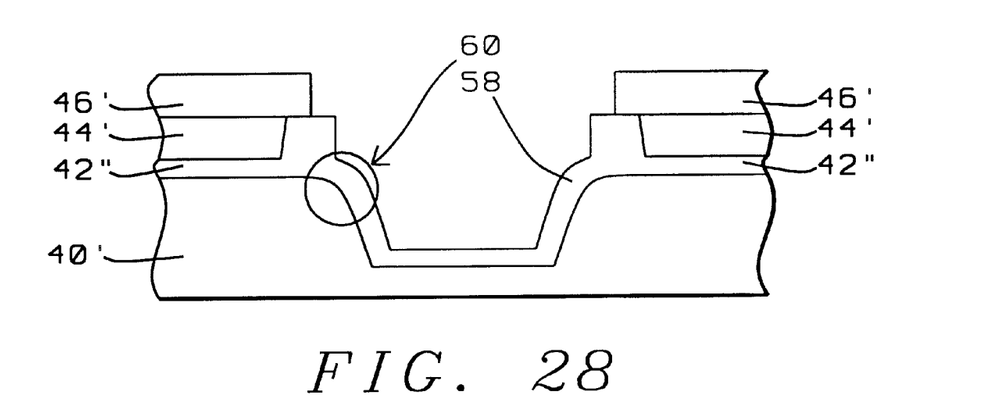

As shown in FIG. 28, a liner oxide layer 58 is formed over the exposed portions of the patterned poly layer 44' and the etched silicon substrate 40' using a high temperature oxidation furnace having a temperature of preferably from about 950 to 1150° C. and more preferably from about 1000 to 1100° C. The liner oxide layer 58 is preferably from about 180 to 620 Å thick and more preferably from about 200 to 600 Å thick. Thicker oxide is formed at the edge of the patterned undoped poly layer 44'. The STI corner (as at 60) will be rounded by the liner oxidation combined with the further pulled back undoped poly layer 42"/undoped poly layer 44'/nitride film 46' pull back.

Deposition of HDP Film 62

Figure 29:
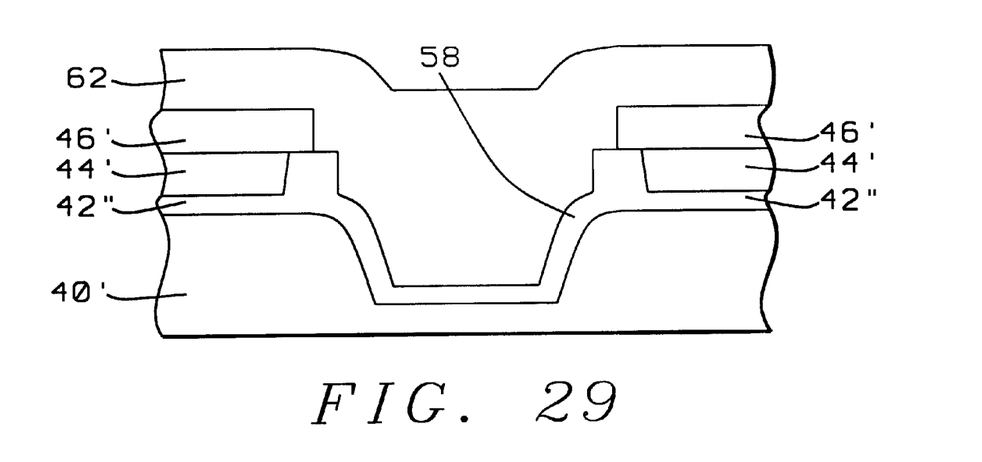

As shown in FIG. 29, high density-plasma (HDP) oxide film 62 is deposited over the patterned nitride film 46' and filling the liner oxide layer 58 lined opening 58 for the STI filling.

Oxide CMP

Figure 30:
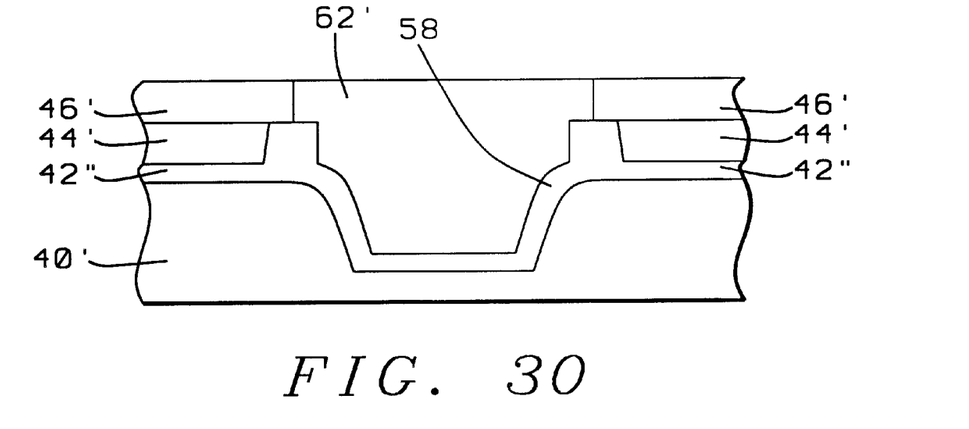

As shown in FIG. 30, an oxide chemical mechanical polish (CMP) is performed to remove the excess of the HDP film 62 to form a planarized structure stopping upon the patterned nitride film 46'.

Removal of Patterned Nitride Film 46' and Further Pulled Back Undoped Poly Layer 42"

Figure 31:
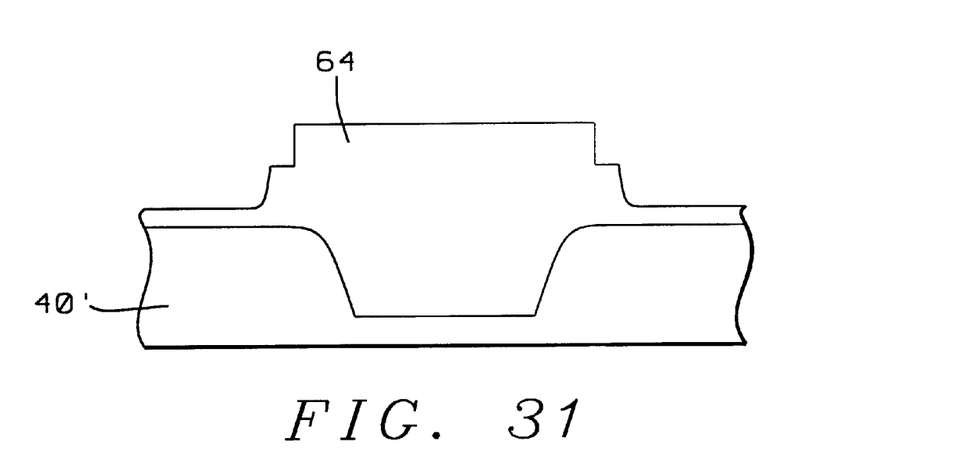

As shown in FIG. 31, the patterned nitride film 46' and the further pulled back undoped poly layer 42" are removed using $H_3PO_4$ ($H_2O/H_3PO_4/H_2O_2$) and an SC1 solution ($H_2O/NH_4OH/H_2O_2$) with a high polysilicon/silicon oxide selectivity.

Final STI Structure 64'

Figure 32:
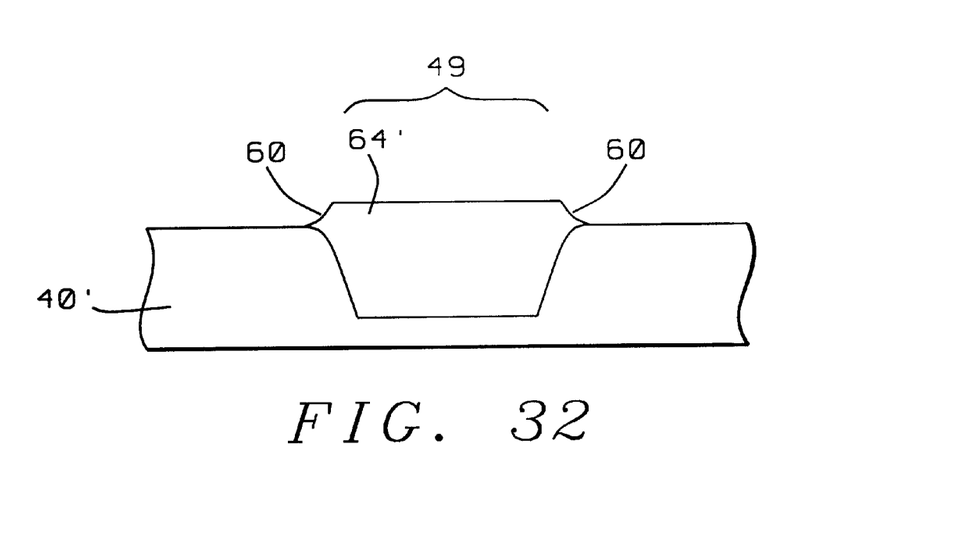

As shown in FIG. 32, the patterned pad oxide layer 42' is removed to form the final STI structure 64' that has rounded corners 60 and without divots.

The disposable spacers 24; 54 can improve both STI corner rounding and divot issues. The sharp corner of the STI trench 26; 56 is exposed (after spacer 24; 54 formation, STI trench 26; 56 etching and removal of the spacers 24; 54) so that the corners 30; 60 can be oxidized more thoroughly during liner 28; 58 oxidation.

Also, the buffer layer 14; 44 of undoped polysilicon is also oxidized during liner 28; 58 oxidation. The oxidized oxide along the undoped poly layer 14'; 44" will further reduce divot formation at the STI edge after pad oxide layer 12'; 42' removal.

The embodiments of the present invention are simple and are compatible with advanced CMOS technology.

ADVANTAGES OF THE PRESENT INVENTION

The advantages of one or more embodiments of the present invention include:

1. a rounder STI corner is achieved by using disposable spacers; and
2. a divot-free STI is achieved.

While particular embodiments of the present invention have been illustrated and described, it is not intended to limit the invention, except as defined by the following claims.

We claim:

1. A method-of fabricating an STI, comprising the steps of:

providing a silicon structure having a pad oxide layer formed thereover;

forming an undoped poly buffer layer over the pad oxide layer;

forming a hard mask layer over the undoped poly buffer layer;

patterning the hard mask layer, the undoped poly buffer layer and the pad oxide layer to form an opening exposing a portion of the silicon structure within an active area; the opening having exposed side walls;

forming inorganic spacers over the exposed side walls;

using the patterned hard mask layer and the spacers as hard masks, etching the silicon structure to form an STI opening within the active area;

removing the inorganic spacers exposing the upper corners of the STI opening;

using an oxidation process, forming a liner oxide layer within the STI opening, over the upper corners of the STI opening and at least the patterned undoped poly buffer layer exposed by the removal of the inorganic spacers;

forming an STI oxide layer over the patterned hard mask layer filling the liner oxide layer lined STI opening; and planarizing the STI oxide layer and removing: the patterned hard mask; the patterned undoped poly buffer layer; and the patterned pad oxide layer to fabricate the STI having rounded corners and without substantial divots.

2. The method of claim 1, wherein: the pad oxide layer is from about 140 to 210 Å thick; the undoped poly buffer layer is from about 900 to 2100 Å thick; the active area is from about 1000 to 5000 Å wide; and the inorganic spacers are from about 100 to 500 Å wide.

3. The method of claim 1, wherein: the pad oxide layer is from about 150 to 200 Å thick; the undoped poly buffer layer is from about 1000 to 2000 Å thick; the active area is from about 1500 to 3000 Å wide; and the inorganic spacers are from about 200 to 300 Å wide.

4. The method of claim 1, wherein the STI oxide layer is planarized by chemical mechanical polishing.

5. The method of claim 1, wherein the silicon structure is a silicon substrate.

6. The method of claim 1, wherein the undoped poly buffer layer is formed within an LPCVD furnace.

7. The method of claim 1, wherein the hard mask layer, the undoped poly buffer layer and the pad oxide layer are patterned using an overlying patterned photoresist layer.

8. The method of claim 1, wherein the hard mask layer, the undoped poly buffer layer and the pad oxide layer are patterned using an overlying patterned photoresist layer and the patterned photoresist layer is removed after the patterning of the hard mask layer, the undoped poly buffer layer and the pad oxide layer and before the formation of the inorganic spacers.

9. The method of claim 1, wherein the hard mask layer is formed by oxidation of the undoped poly buffer layer.

10. The method of claim 1, wherein the hard mask layer is formed by oxidation of the undoped poly buffer layer and the hard mask layer is from about 400 to 1100 Å thick.

11. The method of claim 1, wherein the hard mask layer is formed by oxidation of the undoped poly buffer layer and the hard mask layer is from about 500 to 1000 Å thick.

12. The method of claim 1, wherein the hard mask layer is comprised of silicon oxide.

13. The method of claim 1, wherein the hard mask layer is comprised of nitride or silicon nitride.

14. The method of claim 1, wherein the hard mask layer is from about 900 to 2100 Å thick.

15. The method of claim 1, wherein the hard mask layer is from about 1000 to 2000 Å thick.

16. The method of claim 1, wherein the hard mask layer is comprised of nitride or silicon nitride having a thickness of from about 1000 to 2000 Å thick.

17. A method of fabricating an STI, comprising the steps of:
providing a silicon structure having a pad oxide layer formed thereover;
forming an undoped poly buffer layer over the pad oxide layer;
forming a top oxide hard mask layer over the undoped poly buffer layer;
patterning the top oxide hard mask layer, the undoped poly buffer layer and the pad oxide layer to form an opening exposing a portion of the silicon structure within an active area; the opening having exposed side walls;
forming nitride spacers over the exposed side walls;
using the patterned top oxide hard mask layer and the nitride spacers as hard masks, etching the silicon structure to form an STI opening within the active area;
removing the nitride spacers exposing the upper corners of the STI opening;
using an oxidation process, forming a liner oxide layer within the STI opening, over the upper corners of the STI opening and at least the patterned undoped poly buffer layer exposed by the removal of the nitride spacers;
forming an STI oxide layer over the patterned hard mask layer filling the liner oxide layer lined STI opening; and
removing the patterned top oxide hard mask and planarizing the STI oxide layer by a planarization process;
removing the patterned undoped poly buffer layer; and
removing the patterned pad oxide layer to fabricate the STI having rounded corners and without substantial divots.

18. The method of claim 17, wherein: the pad oxide layer is from about 140 to 210 Å thick; the undoped poly buffer layer is from about 900 to 2100 Å thick; the top oxide hard mask layer is from about 400 to 1100 Å thick; the active area is from about 1000 to 5000 Å wide; and the inorganic spacers are from about 100 to 500 Å wide.

19. The method of claim 17, wherein: the pad oxide layer is from about 150 to 200 Å thick; the undoped poly buffer layer is from about 1000 to 2000 Å thick; the top oxide hard mask layer is from about 500 to 1000 Å thick; the active area is from about 1500 to 3000 Å wide; and the inorganic spacers are from about 200 to 300 Å wide.

20. The method of claim 17, wherein the STI oxide layer is planarized by chemical mechanical polishing.

21. The method of claim 17, wherein the silicon structure is a silicon substrate.

22. The method of claim 17, wherein the undoped poly buffer layer is formed within an LPCVD furnace.

23. The method of claim 17 wherein the top oxide hard mask layer, the undoped poly buffer layer and the pad oxide layer are patterned using an overlying patterned photoresist layer.

24. The method of claim 17, wherein the top oxide hard mask layer, the undoped poly buffer layer and the pad oxide layer are patterned using an overlying patterned photoresist layer and the patterned photoresist layer is removed after the patterning of the top oxide hard mask layer, the undoped poly buffer layer and the pad oxide layer and before the formation of the inorganic spacers.

25. The method of claim 17, wherein the top oxide hard mask layer, the undoped poly buffer layer and the pad oxide layer are patterned using a two-step dry etch process.

26. The method of claim 17, wherein the top oxide hard mask layer is formed by oxidation of the undoped poly buffer layer.

27. The method of claim 17, wherein the nitride spacers are removed employing an $H_2PO_4/H_2O_2$ solution.

28. A method of fabricating an STI, comprising the steps of:
providing a silicon structure having a pad oxide layer formed thereover;
forming an undoped poly buffer layer over the pad oxide layer;
forming a nitride hard mask layer over the undoped poly buffer layer;
patterning the nitride hard mask layer, the undoped poly buffer layer and the pad oxide layer to form an opening exposing a portion of the silicon structure within an active area; the opening having exposed side walls;
forming oxide spacers over the exposed side walls;
using the patterned nitride hard mask layer and the oxide spacers as hard masks, etching the silicon structure to form an STI opening within the active area;
removing the oxide spacers exposing the upper corners of the STI opening;

using an oxidation process, forming a liner oxide layer within the STI opening, over the upper corners of the STI opening and at least the patterned undoped poly buffer layer exposed by the removal of the oxide spacers;

forming an STI oxide layer over the patterned nitride hard mask layer filling the liner oxide layer lined STI opening; and planarizing the STI oxide layer down to the patterned nitride hard mask;

removing the patterned nitride hard mask and the patterned undoped poly buffer layer; and removing the patterned pad oxide layer to fabricate the STI having rounded corners and without substantial divots.

29. The method of claim 28, wherein: the pad oxide layer is from about 140 to 210 Å thick; the undoped poly buffer layer is from about 900 to 2100 Å thick; the nitride hard mask layer is from about 900 to 2100 Å; the active area is from about 1000 to 5000 Å wide; and the inorganic spacers are from about 100 to 500 Å wide.

30. The method of claim 28, wherein: the pad oxide layer is from about 150 to 200 Å thick; the undoped poly buffer layer is from about 1000 to 2000 Å thick; the nitride hard mask layer is from about 1000 to 2000 Å; the active area is from about 1500 to 3000 Å wide; and the inorganic spacers are from about 200 to 300 Å wide.

31. The method of claim 28, wherein the STI oxide layer is planarized by chemical mechanical polishing.

32. The method of claim 28, wherein the silicon structure is a silicon substrate.

33. The method of claim 28, wherein the undoped poly buffer layer is formed within an LPCVD furnace.

34. The method of claim 28, wherein the nitride hard mask layer, the undoped poly buffer layer and the pad oxide layer are patterned using an overlying patterned photoresist layer.

35. The method of claim 28, wherein the nitride hard mask layer, the undoped poly buffer layer and the pad oxide layer are patterned using an overlying patterned photoresist layer and the patterned photoresist layer is removed after the patterning of the nitride hard mask layer, the undoped poly buffer layer and the pad oxide layer and before the formation of the oxide spacers.

36. The method of claim 28, wherein the nitride hard mask layer, the undoped poly buffer layer and the pad oxide layer are patterned using a two-step dry etch process.

37. The method of claim 28, wherein the nitride hard mask layer is comprised of nitride or silicon nitride.

* * * * *